United States Patent
Yang et al.

[11] Patent Number: 6,111,283
[45] Date of Patent: Aug. 29, 2000

[54] TRIPLE WELL STRUCTURE

[75] Inventors: Johnny Yang, Hsinchu; Hsiu-Wen Huang, Kaoshiung, both of Taiwan

[73] Assignee: United Semiconductor Corp., Hsinchu, Taiwan

[21] Appl. No.: 09/241,524

[22] Filed: Feb. 1, 1999

[30] Foreign Application Priority Data

Nov. 13, 1998 [TW] Taiwan .................................. 87118836

[51] Int. Cl.⁷ .......................... H01L 27/108; H01L 29/76; H01L 29/94; H01L 31/119
[52] U.S. Cl. .......................... 257/306; 257/402; 257/345; 257/344; 257/409
[58] Field of Search ..................... 257/306, 285, 257/344, 345, 394, 409, 402, 392, 396

[56] References Cited

U.S. PATENT DOCUMENTS

| | | | |
|---|---|---|---|
| 5,347,153 | 9/1994 | Bakeman, Jr. | 257/345 |
| 5,384,474 | 1/1995 | Park et al. | 257/304 |
| 5,413,949 | 5/1995 | Hong | 438/290 |
| 5,675,172 | 10/1997 | Miyamoto et al. | 257/402 |
| 5,691,560 | 11/1997 | Sakakibara | 257/316 |
| 5,792,699 | 8/1998 | Tsui | 438/290 |

*Primary Examiner*—Steven H. Loke
*Assistant Examiner*—Thien F. Tran
*Attorney, Agent, or Firm*—J. C. Patents; Jiawei Huang

[57] ABSTRACT

A triple well structure for an embedded dynamic random access memory uses an ion implantation performed on a portion of the first conductive type substrate between a second conductive type source and a second conductive type deep well. A first conductive type block region is formed between the second conductive type source and the second conductive type deep well.

11 Claims, 2 Drawing Sheets

TRIPLE WELL STRUCTURE

CROSS-REFERENCE TO RELATED APPLICATION

This application claims the priority benefit of Taiwan application Ser. No. 87118836, filed Nov. 13, 1998, the full disclosure of which is incorporated herein by reference.

BACKGROUND OF THE INVENTION

1. Field of the Invention

The present invention relates to a semiconductor structure. More particularly, the present invention relates to a triple well structure in a semiconductor substrate.

2. Description of the Related Art

Conventional DRAM process commonly utilizes a twin well structure. The twin well includes a P-well, which is often used for forming a memory region and an N-type MOS, and an N-well, which is used for forming a P-type MOS. However, in an embedded DRAM, a memory region and a logical region are incorporated in the same wafer. Since the memory region and the logical region are supplied with different back bias, in order to prevent bias interference between the logical region and the memory region, a third well must be formed to isolate these two regions from each other. Therefore, it is desired to form the third well, such as a deep well, in the substrate to isolate the logical region and the memory region.

FIG. 1 is schematic, cross-sectional view showing a conventional embedded DRAM memory region having a triple well therein.

Reference is made to FIG. 1, which shows a variety of devices formed on the P-type substrate 200. The active devices of FIG. 1 are described as follows. A transistor 202 is located on the P-type substrate 200. The transistor 202 includes an N-type gate 204, an N-type source 206, and an N-type drain 208. The N-type gate 204 is located on the P-type substrate 200. The N-type source 206 and the N-type drain 208 are in the P-type substrate 200 on different sides of the N-type gate 204. The N-type drain 208 and a capacitor 215 are electrically coupled.

A P-type field 220 is located in the P-type substrate 200 under the transistor 202. An isolation layer 230 and an isolation layer 235 are formed over the first conductive type substrate 200 to isolate active devices from each other. The isolation layer 230 covers an isolation structure 222 and the transistor 202. The isolation layer 235 covers the capacitor 215 and the isolation layer 230. A contact opening 210 is formed in the isolation layer 230 and the isolation layer 235 to expose the N-type source 206. The contact opening 210 is formed for the formation of a bit line (not shown) by the subsequent process.

The isolation devices of FIG. 1 are described as follows. The isolation structure 222 encircles the transistor 202. An isolation N-well 224 is formed under the isolation structure 222 and in contact with the isolation structure 222. A deep N-well 226 underlies the P-type field 220. The isolation N-well 224 is perpendicular to the deep N-well 226. A bottom portion of the isolation N-well 224 overlaps with a side portion of the deep N-well 226. The N-type isolation well 224 and the deep N-well 226 together surround a portion of the P-type substrate 200, which is employed as a P-well 228. The isolation N-well 224, the P-well 228, and the deep N-well 226 together form a triple well structure.

An N-plug 245 is formed in the P-type substrate 200 under the N-type source 206 and in contact with the N-type source 206. The N-plug 245 is used to enlarge and deepen the range of the N-doped region with the N-source, which reduces the current leakage from the bit line to the P-type regions, such as the P-type field 220 or the P-well 228, that near the N-type source 206.

However, the N-plug 245 and the deep N-well 226 are close to each other, and this, in turn, increases the punch-through effect between the N-plug 245 and the deep N-well 226. In order to decrease the punchthrough effect, P-type ion concentration of the P-type regions near the N-type plug 245 and the deep N-well 226 must be increased.

Unfortunately, as P-type ion concentration of P-type regions near the N-plug 245 and the deep N-well 226 increases, junction leakage between the N-plug 245 and neighboring P-type regions increases correspondingly. Thus, in contrast, in order to prevent junction leakage, it is necessary to reduce the concentration of the neighboring P-type regions. So, in practice, it is difficult to decide whether or not to increase or decrease the concentration of the P-type regions, such as the P-type field 220.

SUMMARY OF THE INVENTION

Accordingly, the purpose of the present invention is to provide a triple well structure for an embedded DRAM. A transistor is formed on a first conductive type substrate. The transistor comprises a second conductive type gate, a second conductive type source, and a second conductive type drain. The second conductive type gate is on the first conductive type substrate. The second source and the second drain are on different sides of the second conductive type gate in the first conductive type substrate. There is an isolation structure in the first conductive type substrate. The isolation structure surrounds the transistor. A second conductive type isolation well is in the first conductive type substrate. The second conductive type isolation well is under the isolation structure and in contact with the isolation structure. A second conductive type deep well is in the first conductive type substrate under the transistor. A bottom portion of the second conductive type isolation well overlaps with a side portion of the second conductive type deep well. A first conductive type well is in the first conductive type substrate. The second conductive type isolation well encircles the first conductive type well and the second type deep well underlies the first conductive type well, such that the first conductive type well is surrounded by the second conductive type isolation well together with the second conductive type deep well. A first conductive type block region is between the second conductive type source and the second conductive type deep well and below the second conductive type source.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
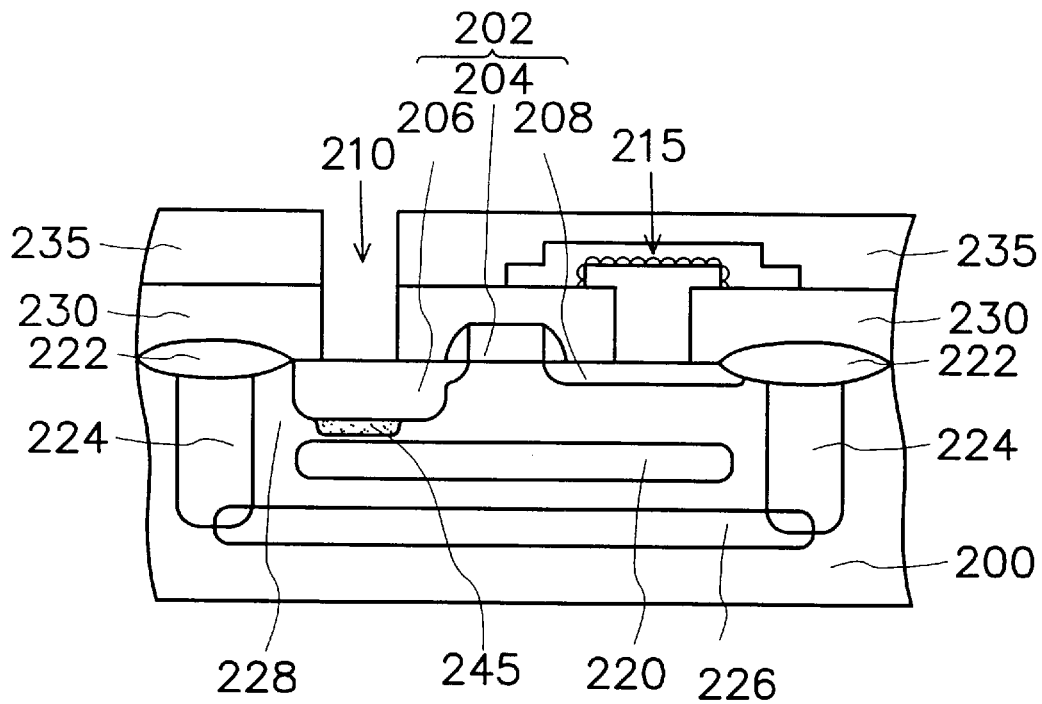
FIG. 1 is a schematic, cross-sectional view showing a conventional embedded DRAM memory region having a triple well therein.

Reference will now be made in detail to the present preferred embodiments of the invention, examples of which are illustrated in the accompanying drawings. Wherever possible, the same reference numbers are used in the drawings and the description to refer to the same or like parts.

Figure 2:
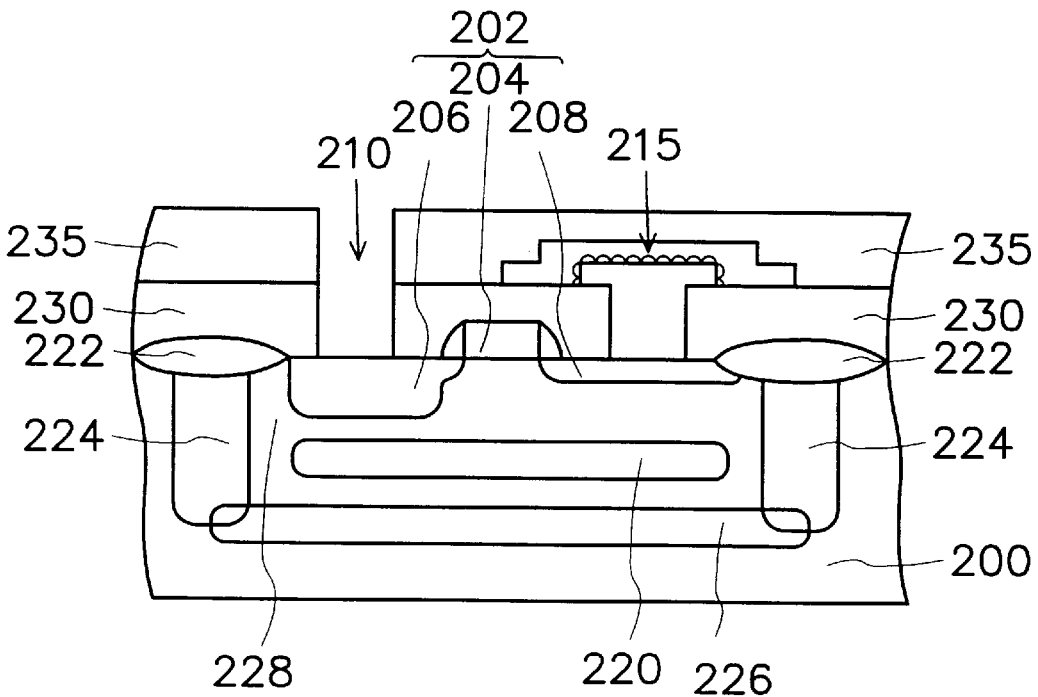
FIGS. 2 through 4 are schematic, cross-sectional views showing a fabricating process for an embedded DRAM memory region having a triple well therein according to one preferred embodiment of the invention.

Reference is made to FIG. 2, which shows a variety of devices formed on the first conductive type substrate 200. In the preferred embodiment, a portion of a cell under bit line (CUB) DRAM is taken as an example. The active devices of FIG. 2 include the devices described as follows. A transistor 202 is located on the first conductive type substrate 200. The transistor 202 includes a second conductive type gate 204, a second conductive type source 206, and a second conductive type drain 208. The second conductive type gate 204 is located on the first conductive type substrate 200. The second conductive type source 206 and the second conductive type drain 208 are in the first conductive type substrate 200 on different sides of the second conductive type gate 204. The second conductive type drain 208 and a capacitor 215 are electrically coupled.

A first conductive type field 220 is located in the first conductive type substrate 200 under the transistor 202. The first conductive type field 220 is used to prevent the punchthrough effect between the second conductive type source 206 and the second conductive type drain 208. When the first conductive type is P-type, the ions implanted in the first conductive type field 220 can be, for example, boron (B) ions, or the like. The implantation energy for forming the first conductive type field 220 preferably is 150 KeV. The concentration of the first conductive type field 220 preferably is about $6 \times 10^{12}$ ions/cm$^3$. An isolation layer 230 and an isolation layer 235 are formed over the first conductive type substrate 200 to isolate active devices from each other. The isolation layer 230 covers an isolation structure 222 and the transistor 202. The isolation layer 235 covers the capacitor 215 and the isolation layer 230. The material of the isolation layer 230 and the isolation layer 235 can be, for example, silicon oxide. The isolation layer 230 and the isolation layer 235 can be formed by chemical vapor deposition (CVD), for example. A contact opening 210 is formed in the isolation layer 230 and the isolation layer 235 to expose the second conductive type source 206. The contact opening 210 is formed for formation of a bit line (not shown) by the subsequent process.

As it is to be seen as follows, isolation devices formed in the first conductive type substrate 200 are described. The isolation structure 222 encloses the transistor 202. The isolation structure 222 can be, for example, a field oxide layer, a shallow trench isolation, or other isolation structures. A second conductive type isolation well 224 is formed under the isolation structure 222 and in contact with the isolation structure 222. A second conductive type deep well 226 is formed under the first conductive type field 220. The second conductive type isolation well 224 is perpendicular to the second conductive type deep well 226. A bottom portion of the second conductive type isolation well 224 overlaps with a side portion of the second conductive type deep well 226. The second conductive type deep well 226 and the second conductive type isolation well 224 are used to isolate a memory region and the logical region from each other. When the second conductive type is N-type, phosphorous (P) ions, or the like, preferably are implanted to form the second conductive type deep well 226. The implantation energy for forming the second conductive type deep well 226 preferably is about 1800 KeV. The second conductive type deep well 226 is formed with a preferred concentration of about $1 \times 10^{13}$ ions/cm$^3$.

A portion of the first conductive type substrate 200 surrounded by the second conductive type isolation well 224 together with the second conductive type deep well 226 is a first conductive type well 228. That is, the second conductive type isolation well 224 encircles the first conductive type well 228 and the second conductive type deep well 226 underlies the first conductive type well 228. When the first conductive type is P-type, ions implanted to form the first conductive type well 228 can be boron (B) ions, or the like, for example. The energy of ion implantation preferably is about 180 KeV. The concentration of the first conductive type well 228 preferably is about $9 \times 10^{12}$ ions/cm$^3$.

Figure 3:
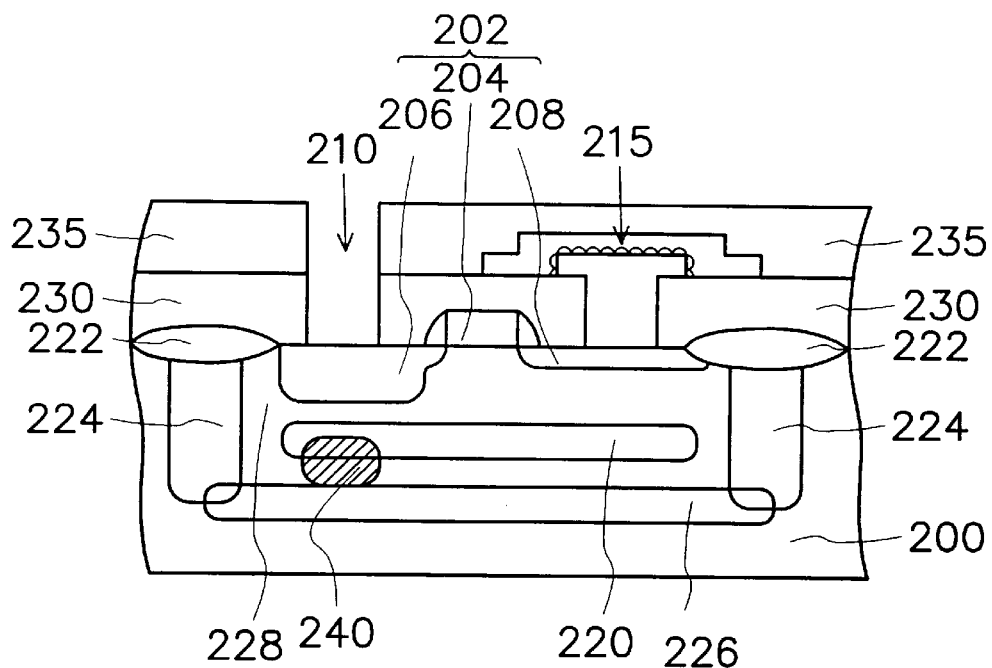

In FIG. 3, a first conductive type ion implantation is performed on the first conductive type substrate 200 exposed by the contact opening 210. A first conductive type block region 240 is formed in the first conductive type substrate 200 between the first conductive type field 220 and the second conductive type deep well 226 and under the second conductive type source 206. The first conductive type block region 240 overlaps with the first conductive type field 220. Since the ion implantation is performed through the contact opening 210, the planar area of the first conductive type block region 240 substantially the same as the planar area of the contact opening 210. When the first conductive type is P-type, boron (B) ions, or the like, are preferably doped with an energy of 200 KeV to form the first conductive type block region 240. The concentration of the first conductive type block region 240 preferably is about $1 \times 10^{13}$ ions/cm$^3$.

Figure 4:
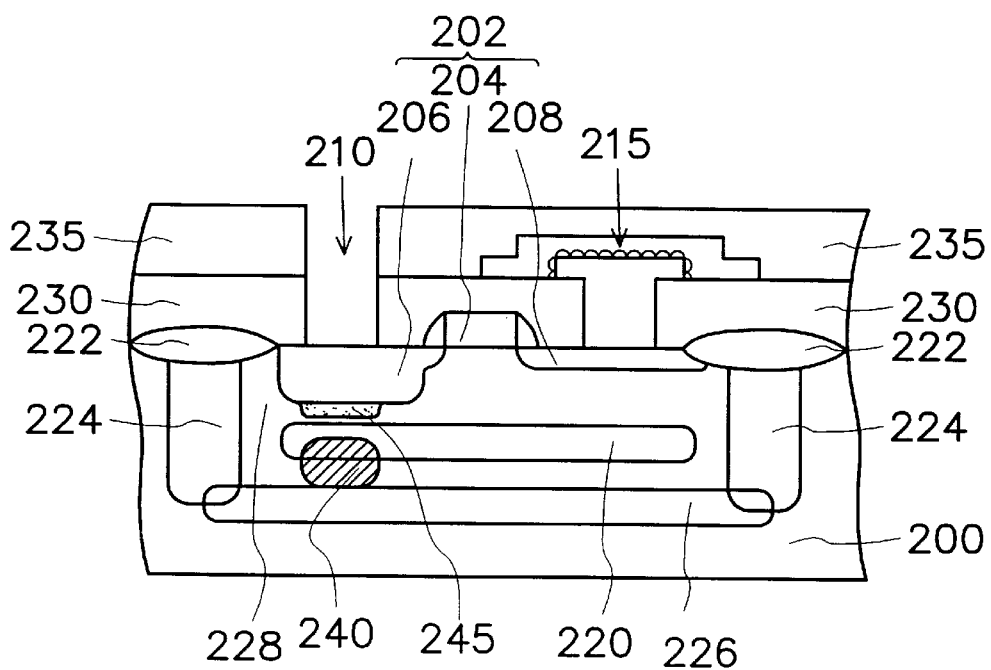

In FIG. 4, a second conductive type ion implantation is performed on a portion of the first conductive type substrate 200 exposed by the contact opening 210. A second conductive type plug 245 is formed under the second conductive type source 206 and in contact with the second conductive type source 206. Since, the first conductive type block region 240 and the second conductive type plug 245 are both formed by ion implantation through the contact opening 210, such that the planar areas of the first conductive type block region 240 and the second conductive type plug 245 are substantially the same. The second conductive type plug 245 is used to enlarge and deepen the range of the second conductive type doped region with the second conductive type source 206. The present invention uses the second conductive type plug region 245. In this manner, the concentrations of the first conductive type well 228 and the first conductive type field 220 do not need to be increased so that it prevents current leakage between a bit line (not shown) and the first conductive type deep well 228. When the second conductive type is N-type, phosphorous (P) ions, or the like, preferably are doped with an energy of about 70 KeV. The concentration of the second conductive type plug region 245 is about $3 \times 10^{15}$ cm$^3$.

In summary, the invention has the following advantages:

1. The invention forms the first conductive type block region 240 between the second conductive type plug region 245 and the second conductive type deep well 226. The local ion concentration of the first conductive type thus is increased, which prevents the punchthrough effect between the second conductive type plug region 245 and the second conductive type deep well 226.

2. In the present invention, the concentrations of the first conductive type well 228 and the first conductive type field 220 do not need to be further increased. This prevents the junction leakage between the second conductive type plug region 245 and neighboring first conductive type well 228, and the first conductive type field 220. Thus, the risk of device failure is significantly reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A triple well structure, wherein the triple well structure is suitable for being used in an embedded dynamic random access memory (embedded DRAM), comprising:
    a first conductive type substrate, comprising:
        a transistor comprising a second conductive type gate, a second conductive type source, and a second conductive type drain, wherein the second conductive type gate is on the first conductive type substrate, and the second conductive type source and the second conductive type drain are on different sides of the second conductive type gate in the first conductive type substrate;
        an isolation structure in the first conductive type substrate, wherein the isolation structure encircles the transistor;
        a second conductive type isolation well in the first conductive type substrate, wherein the second conductive type isolation well is under the isolation structure and in contact with the isolation structure; and
        a second conductive type deep well in the first conductive type substrate under the transistor, wherein a bottom portion of the second conductive type isolation well overlaps with a side portion of the second conductive type deep well;
    a first conductive type well in the first conductive type substrate, wherein the second conductive type isolation well encircles the first conductive type well and the second conductive type deep well underlies the first conductive type well, such that the first conductive type well is surrounded by the second conductive type isolation well together with the second conductive type deep well;
    a first conductive type block region between the second conductive type source and the second conductive type deep well, wherein the first conductive type block region is directly under the second conductive type source and does not directly connect with the second conductive type source; and
    a first conductive type field in the first conductive type substrate between the transistor and the second conductive type deep well, wherein the first conductive type block region overlaps with the first conductive type field.

2. The structure of claim 1, further comprising a second conductive type plug in the first conductive type substrate between the second conductive type source and the first conductive type block region and under the second conductive type source.

3. The structure of claim 2, wherein the first conductive type block region and the second conductive type plug are formed using the same mask so that the planar area of the first conductive type block region and a planar area of the second conductive type plug are substantially the same.

4. The structure of claim 2, wherein concentration of the second conductive type plug is about $3 \times 10^{15}$ ions/cm$^3$.

5. The structure of claim 1, wherein the first conductive type is N-type and the second conductive type is P-type.

6. The structure of claim 1, wherein the first conductive type is P-type and the second conductive type is N-type.

7. The structure of claim 1, wherein concentration of the first conductive type field is about $6 \times 10^{12}$ ions/cm$^3$.

8. The structure of claim 1, wherein concentration of the second conductive type deep well is about $1 \times 10^{13}$ ions/cm$^3$.

9. The structure of claim 1, wherein concentration of the first conductive type well is about $9 \times 10^{12}$ ions/cm$^3$.

10. The structure of claim 1, wherein concentration of the first conductive type block region is about $1 \times 10^{13}$ ions/cm$^3$.

11. A triple well structure, wherein the triple well structure is suitable for being used in an embedded dynamic random access memory (embedded DRAM), comprising:
    a first conductive type substrate, comprising:
        a transistor having a second conductive type gate, a second conductive type source, and a second conductive type drain;
        an isolation structure in the first conductive type substrate, wherein the isolation structure encircles the transistor;
        a second conductive type isolation well in the first conductive type substrate, wherein the second conductive type isolation well is under the isolation structure and in contact with the isolation structure; and
        a second conductive type deep well in the first conductive type substrate under the transistor, wherein a bottom portion of the second conductive type isolation well overlaps with a side portion of the second conductive type deep well;
    a first conductive type well in the first conductive type substrate, wherein the second conductive type isolation well encircles the first conductive type well and the second conductive type deep well underlies the first conductive type well, such that the first conductive type well is surrounded by the second conductive type isolation well together with the second conductive type deep well;
    a second conductive type plug in the first conductive type substrate between the second conductive type source and the first conductive type well and under the second conductive type source;
    a first conductive type block region between the second conductive type source and the second conductive type deep well and under the second conductive type source, wherein the planar area of the first conductive type block region and the planar area of the second conductive type plug are substantially the same, and the first conductive type block region does not directly connect the second conductive type source; and
    a first conductive type field in the first conductive type substrate between the transistor and the second conductive type deep well, wherein the first conductive type block region overlaps with the first conductive type field.

* * * * *